US006489628B1

(12) United States Patent
Morizuka

(10) Patent No.: US 6,489,628 B1
(45) Date of Patent: Dec. 3, 2002

(54) HIGH ELECTRON MOBILITY TRANSISTOR AND POWER AMPLIFIER

(75) Inventor: Mayumi Morizuka, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 93 days.

(21) Appl. No.: 09/606,015

(22) Filed: Jun. 29, 2000

(30) Foreign Application Priority Data

Jun. 30, 1999 (JP) ........................................ 11-184647
Jun. 15, 2000 (JP) ........................................ 2000-179544

(51) Int. Cl.[7] ........................................ H01L 29/06

(52) U.S. Cl. ........................ 257/12; 257/190; 257/191; 257/192; 257/201

(58) Field of Search ........................ 257/183.1, 15, 257/192, 96, 190

(56) References Cited

U.S. PATENT DOCUMENTS 5,192,987 A * 3/1993 Khan et al. .............. 257/183.1
5,847,409 A * 12/1998 Nakayama ................... 257/15
6,008,509 A * 12/1999 Inai et al. .................. 257/192
6,046,464 A * 4/2000 Schetzina .................... 257/96
6,064,082 A * 5/2000 Kawai et al. ............... 257/192
6,242,764 B1 * 6/2001 Ohba et al. ................. 257/190

OTHER PUBLICATIONS

O. Aktas, et al. "Microwave Performance of AlGaN/GaN Inverted MODFET's," IEEE Electron Device Letters, vol. 18, No. 6, Jun. 1997, pp. 293–295.

Y.–F. Wu, et al. "Bias Dependent Microwave Performance of AlGaN/GaN MODFET's Up To 100 V," IEEE Electron Device Letters, vol. 18, No. 6, Jun. 1997, pp. 290–292.

* cited by examiner

*Primary Examiner*—David Nelms
*Assistant Examiner*—Mai-Huong Tran
(74) *Attorney, Agent, or Firm*—Oblon, Spivak, McClelland, Maier & Neustadt, P.C.

(57) ABSTRACT

According to this invention, a group III nitride inverted high electron mobility transistor, and a power amplifier using the same are provided. A transistor and power amplifier according to this invention are characterized in that the lattice constant of a bulk of a donor layer is larger than that of an underlayer containing a group III nitride compound semiconductor material, or the donor layer is made of impurity-doped $Al_yGa_{(1-y)}N$, the underlayer is made of undoped $Al_xGa_{(1-x)}N$, and x and y satisfy an inequality $0 \leqq y < x \leqq 1$.

6 Claims, 4 Drawing Sheets

17 16 18 10a
11
13
14
15

HIGH ELECTRON MOBILITY TRANSISTOR AND POWER AMPLIFIER

CROSS-REFERENCE TO RELATED APPLICATIONS

This application is based upon and claims the benefit of priority from the prior Japanese Patent Applications No. 11-184647, filed Jun. 30, 1999; and No. 2000-179544, filed Jun. 15, 2000, the entire contents of which are incorporated herein by reference.

BACKGROUND OF THE INVENTION

The present invention relates to a high electron mobility transistor and power amplifier and, more particularly, to a group III nitride inverted high electron mobility transistor and a power amplifier using the same.

Since field effect transistors (FETS) using a group III nitride compound semiconductor material, especially, gallium nitride (GaN) can realize high output power in the high-frequency range, they are expected to be used as power elements. As such transistors, a metal-semiconductor field effect transistor (MESFET), high electron mobility transistor (HEMT), metal-insulator field effect transistor (MISFET), and the like have been proposed.

Among these transistors, according to a GaN-based HEMT which has an AlGaN layer as a donor layer and a GaN layer as a channel layer, higher density of two-dimensional electron gas can be realized in the channel layer compared to a GaAs-based HEMT which has an AlGaAs layer as a donor layer and a GaAs layer as a channel layer. Therefore, the GaN-based HEMT is considered as a very promising high-output element. However, in order to realize high-output characteristics by the GaN-based HEMT, some problems remain unsolved, as will be described below.

FIG. 1 is a schematic sectional view showing a conventional GaN-based normal HEMT. A GaN-based HEMT 110*a* shown in FIG. 1 has the following structure. That is, a GaN underlayer 114, a GaN channel layer 111, and an $Al\alpha Ga_{(1-60)}N$ ($0<\alpha<1$) donor layer 113 are stacked in turn on a substrate 115, and a gate electrode 116, and source and drain electrodes 117 and 118 are formed on the AlGaN layer 113.

In such structure, a good ohmic contact must be achieved between the source and drain electrodes 117 and 118, and the AlGaN layer 113. However, since the AlGaN layer 113 has a broad band gap, it is hard to achieved a good ohmic contact between the source and drain electrodes 117 and 118, and the AlGaN layer 113. For this reason, in the GaN-based HEMT 110*a* shown in FIG. 1, the contact resistance between the source and drain electrodes 117 and 118, and the AlGaN layer 113 is large. Hence, the GaN-based normal HEMT structure shown in FIG. 1 cannot realize sufficiently high output.

A structure shown in FIG. 2 is known as the one for combating the problems that have been explained in association with the GaN-based normal HEMT structure shown in FIG. 1. FIG. 2 is a schematic sectional view showing a conventional GaN-based inverted HEMT (IHEMT). In this GaN-based inverted HEMT 110*b*, an $Al_\alpha Ga_{(1-\alpha)}N$ ($0<\alpha<1$) donor layer 113 is formed on a GaN underlayer 114 as in a GaAs-based inverted HEMT. A GaN channel layer 111 is stacked on the AlGaN layer 113, and a gate electrode 116, and source and drain electrodes 117 and 118 are formed on the GaN layer 111 (O. Aktas, et al., IEEE Electron Device letters, Vol. 18, No. 6, pp. 293–295, 1997).

The GaN-based inverted HEMT 110*b* shown in FIG. 2 is mainly different from the GaN-based normal HEMT 110*a* shown in FIG. 1 in that the $Al\alpha Ga_{(1-\alpha)}N$ donor layer 113 is located between the GaN channel layer 111 and GaN underlayer 114. In such inverted HEMT, the source and drain electrodes 117 and 118 are formed on the GaN layer 111 unlike the normal HEMT. Also, the band gap of the GaN layer is narrower than that of the AlGaN layer. Therefore, according to the inverted HEMT 110*b* shown in FIG. 2, the aforementioned problem of the contact resistance can be avoided.

However, the difference between the lattice constants of GaN and $Al\alpha Ga_{(1-\alpha)}N$ is one or more orders of magnitudes larger than that between GaAs and $Al\alpha Ga_{(1-\alpha)}As$. For this reason, in the GaN-based inverted HEMT 110*b* shown in FIG. 2, larger piezoelectric charges are produced compared to the GaAs-based inverted HEMT. The piezoelectric charges act to reduce the density of two-dimensional electron gas in the GaN channel layer 111 with respect to the HEMT 110*b* having the structure shown in FIG. 2. Therefore, even the GaN-based inverted HEMT structure shown in FIG. 2 cannot realize sufficiently high output power.

BRIEF SUMMARY OF THE INVENTION

It is an object of the present invention to provide a group III nitride high electron mobility transistor which can realize high output power.

It is another object of the present invention to provide a power amplifier using a group III nitride high electron mobility transistor which can realize high output power.

According to the first aspect of the present invention, there is provided a group III nitride high electron mobility transistor comprising an underlayer comprising a first group III nitride compound semiconductor material, a donor layer formed on the underlayer and comprising a second group III nitride compound semiconductor material, a lattice constant of a bulk of the donor layer being larger than a lattice constant of the underlayer, a channel layer formed on the donor layer and comprising a third group III nitride compound semiconductor material, and gate, source, and drain electrodes formed on the channel layer.

According to the second aspect of the present invention, there is provided a group III nitride high electron mobility transistor comprising an underlayer comprising $Al_xGa_{(1-x)}N$, a donor layer formed on the underlayer and comprising $Al_yGa_{(1-y)}N$, x and y satisfying an inequality $0\leqq y<x\leqq 1$, a channel layer formed on the donor layer and comprising a nitrogen compound, and gate, source, and drain electrodes formed on the channel layer.

According to the third aspect of the present invention, there is provided a power amplifier comprising a group III nitride high electron mobility transistor. which comprises an underlayer comprising a first group III nitride compound semiconductor material, a donor layer formed on the underlayer and comprising a second group III nitride compound semiconductor material, a lattice constant of a bulk of the donor layer being larger than a lattice constant of the underlayer, a channel layer formed on the donor layer and comprising a third group III nitride compound semiconductor material, and gate, source, and drain electrodes formed on the channel layer, an input terminal receiving an input signal and is connected to the gate electrode, an output terminal outputting an output signal and connected to the drain electrode, and a power source connected to the drain electrode via a choke coil.

According to the fourth aspect of the present invention, there is provided a power amplifier comprising group III nitride high electron mobility transistor comprising an underlayer comprising $Al_xGa_{(1-x)}N$, a donor layer formed on the underlayer and comprising $Al_yGa_{(1-y)}N$, x and y satisfying an inequality $0 \leqq y < x \leqq 1$, a channel layer formed on the donor layer and comprising a nitrogen compound, and gate, source, and drain electrodes formed on the channel layer, an input terminal receiving an input signal and connected to the gate electrode, an output terminal outputting an output signal and connected to the drain electrode, and a power source connected to the drain electrode via a choke coil.

As described above, the conventional GaN-based IHEMT has a structure in which an $Al\alpha Ga_{(1-\alpha)}N$ ($0<\alpha<1$) donor layer having a smaller lattice constant than that of GaN is stacked on a GaN underlayer. In such structure, since positive piezoelectric charges are produced near the interface of the donor layer with the underlayer, and negative piezoelectric charges are produced near the interface of the donor layer with the channel layer, the density of two-dimensional electron gas in the channel layer lowers. For this reason, the conventional GaN-based IHEMT cannot realize sufficiently high output power.

By contrast, in a group III nitride IHEMT of the present invention, the lattice constant of the bulk of the donor layer is larger than that of the underlayer. Therefore, when a combination of materials that can produce negative piezoelectric charges near the interface of the donor layer with the underlayer is selected from those that satisfy the aforementioned condition, the density of two-dimensional electron gas in the channel layer can be sufficiently raised. That is, sufficiently high output power can be realized. Note that the term "bulk" used herein means a solid which extends three-dimensionally, and has a size large enough to ignore effects of surfaces, interfaces, and edges.

In order to produce the aforementioned piezoelectric charges, for example, $Al_xGa_{(1-x)}N$ can be used as the first group III nitride compound semiconductor material that forms the underlayer, and $Al_yGa_{(1-y)}N$ can be used as the second group III nitride compound semiconductor material that forms the donor layer (x and y satisfy inequality $0 \leqq y < x \leqq 1$). When these materials are used as the first and second group III nitride compound semiconductor materials, very high output power can be realized.

In the group III nitride IHEMT of the present invention, for example, GaN can be used as the third group III nitride compound semiconductor material that forms the channel layer. Alternatively, $In_zGa_{(1-z)}N$ may be used as the third group III nitride compound semiconductor material (z satisfies inequality $0<z<1$).

The group III nitride IHEMT of the present invention may have a spacer layer, which comprises the fourth group III nitride compound semiconductor material, between the donor layer and channel layer. For example, when the aforementioned materials are used as the first and second group III nitride compound semiconductor materials, $Al_yGa_{(1-y)}N$ can be used as the fourth group III nitride compound semiconductor material.

In the group III nitride IHEMT of the present invention, the underlayer may be a thin film formed on a substrate such as a wafer, or may be a substrate itself such as a wafer. In the former case, the underlayer can be obtained by crystal growth of the first nitrogen compound on the substrate. In this case, it is preferable that a nucleation layer that provides a nucleus for that crystal growth be formed on the substrate, and crystals of first group III nitride compound semiconductor material then be grown.

In the group III nitride IHEMT of the present invention, the density of negative piezoelectric charges produced near the interface of the donor layer with the underlayer is preferably about $10^{10}/cm^{-2}$ or higher when it is divided by the absolute value of electron charges. On the other hand, the difference between the lattice constants of the bulk of the donor layer and the underlayer is preferably 0.0009% or higher with respect to the lattice constant of the bulk of the donor layer. Alternatively, the difference between the molar ratios of Al in the donor layer and that in the underlayer is preferably 0.00035 or more. In these cases, the effect of increasing the density of two-dimensional electron gas in the channel layer improves.

The lattice constants and compositions of the individual layers that form the group III nitride IHEMT of the present invention can be measured by known methods such as X-ray diffraction, elemental analysis, and the like. That is, when the donor layer consists of mixed crystals like $Al_yGa_{(1-y)}N$, if the molar ratios of the constituent elements are obtained by a known method, the lattice constant of that bulk can be calculated using the vegard's law.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
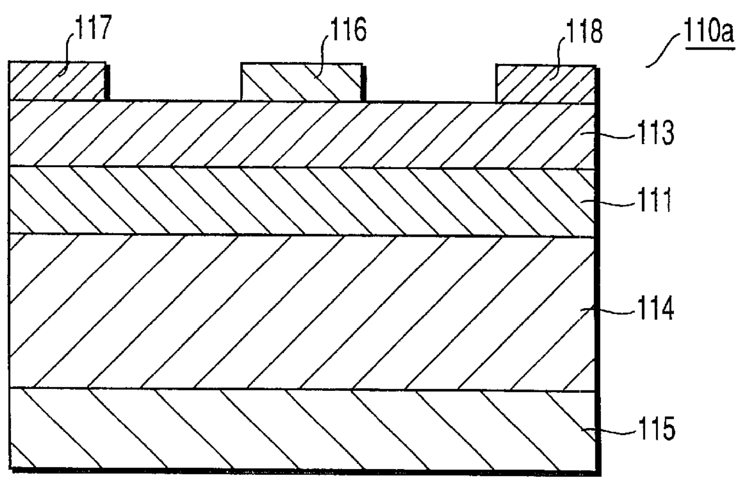
FIG. 1 is a schematic sectional view showing a conventional GaN-based normal HEMT.

The present invention will be described in more detail hereinafter with reference to the accompanying drawings. Note that the same reference numerals denote the same or similar components throughout the drawings, and a repetitive description thereof will be avoided. Note that the respective drawings are schematically illustrated, and the relationship between the thickness of each layer and the dimensions in the planar direction, and that among the thicknesses of the layers can be different from actual ones.

Figure 3:
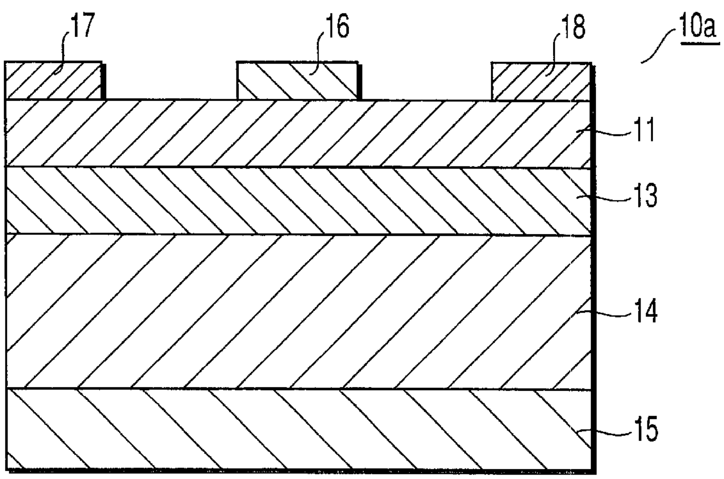
FIG. 3 is a schematic sectional view showing a group III nitride inverted HEMT according to the first embodiment of the present invention.

FIG. 3 is a schematic sectional view of a group III nitride IHEMT according to the first embodiment of the present invention. An IHEMT 10a shown in FIG. 3 is a GaN-based IHEMT, and has the following structure. That is, an $Al_xGa_{(1-x)}N$ underlayer 14, a donor layer 13 containing $Al_yGa_{(1-y)}N$ as a major component, and a GaN channel layer 11 are formed in turn on one major surface of a sapphire substrate 15, and a gate electrode 16, source electrode 17, and drain electrode 18 are formed on the channel of the channel layer 11. Note that the donor layer 13 apparently supplies electrons to the channel layer 11.

The GaN-based IHEMT 10a with such structure can be fabricated by, e.g., the following method. A sapphire substrate 15, a (0001) surface of which was exposed, was prepared. $Al_{0.3}Ga_{0.7}N$ was grown on the (0001) surface of the sapphire substrate 15 by metal organic chemical vapor deposition (MOCVD) to form a 500-nm thick, undoped underlayer 14. Furthermore, $Al_{0.15}Ga_{0.85}N$ was grown on this underlayer 14 by MOCVD to form a 17-nm thick donor layer 13.

Note that these crystal growth processes used a first source gas containing an organometallic compound having Ga (e.g., trimethyl gallium), a second source gas containing an brganometallic compound having Al (e.g., trimethyl aluminum), and a third source gas containing a chemical substance having nitrogen (e.g., ammonia). When these gases are used, the underlayer 14 and donor layer 13 can be formed by making at least one of the flow rates of the first and second source gases different between these crystal growth processes. More specifically, by at least one of increasing the flow rate of the first source gas and decreasing that of the second source gas, a donor layer 13 having a lower Al concentration than the underlayer can be formed. On the other hand, the donor layer 13 contained Si as a donor impurity at a concentration of $5\times10^{18}$ $cm^{-3}$. As a source gas for doping this Si, silane or organic silane such as tetraethyl silane was used.

Subsequently, GaN was grown on the donor layer 13 by MOCVD using trimethyl gallium and ammonia as source gases to form a 50-nm thick undoped channel layer 11.

After that, a 25-nm thick Ti film, 250-nm thick Al film, 40-nm thick Ti film, and 45-nm thick Au film were formed in turn by deposition on the channel layer 11, and an ohmic electrode formed by these thin films was patterned to obtain source and drain electrodes 17 and 18. Furthermore, a Schottky electrode was formed by sequentially stacking a 50-nm thick Ni film and 250-nm thick Au film by deposition on a region on the channel layer 11 between the electrodes 17 and 18, and was patterned to obtain a gate electrode 16 having a gate length of 1 μm. In this way, the GaN-based IHEMT 10a shown in FIG. 3 was fabricated.

Upon examining the characteristics of this GaN-based IHEMT 10a, the threshold voltage was −3V, and the maximum drain current was 0.8 A per unit gate width (1 mm). Also, the knee voltage was 2.5V, and the cutoff frequency was 10 GHz.

Furthermore, the maximum output power was 2.5 W at a power supply voltage of 15V and a frequency of 4 GHz. This value is greatly higher than the output power of 1.5 W of the GaN-based IHEMT (gate length=1 μm) with the structure shown in FIG. 2. When the output power of the GaN-based IHEMT according to this embodiment, which was fabricated by the aforementioned method, was measured at a power supply voltage of 28V and a frequency of 4 GHz, a value 3.8 W was obtained. This value is far higher than 1.57 W as a value reported by Y. F. Wu et al., in IEEE Electron Device Letters Vol. 18, No. 6, pp. 290–292, 1997, in relation to a GaN-based HEMT (gate length=1 μm) having the same structure as that shown in FIG. 1.

Figure 4:
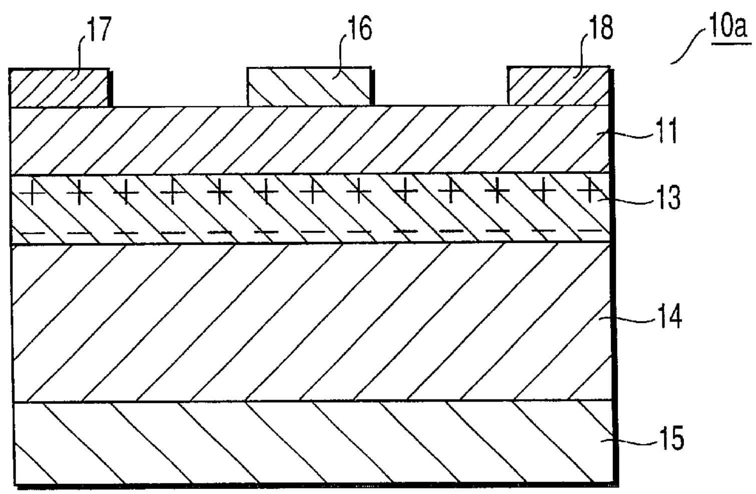
FIG. 4 is a schematic sectional view showing the influences of piezoelectric charges on the group III nitride inverted HEMT shown in FIG. 3.
Figure 5:
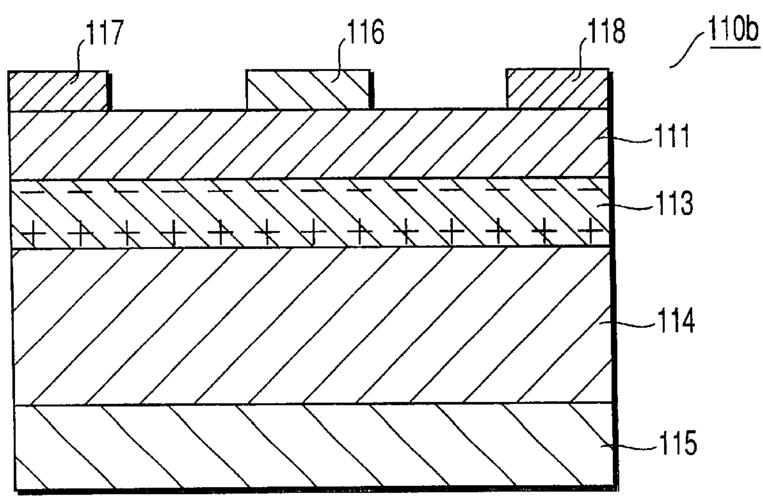
FIG. 5 is a schematic sectional view showing the influences of piezoelectric charges on the conventional GaN-based inverted HEMT shown in FIG. 2.

As described above, according to the GaN-based IHEMT 10a of this embodiment, the obtained output power was far higher than those of the conventional normal and inverted HEMTs. The reason for such high performance will be explained below with reference to FIGS. 4 and 5. Note that FIG. 4 is a schematic sectional view showing the influences of piezoelectric charges on the GaN-based IHEMT 10a shown in FIG. 3, and FIG. 5 is a schematic sectional view showing the influences of piezoelectric charges on the GaN-based IHEMT 110b shown in FIG. 2.

The reason why the GaN-based IHEMT 10a according to this embodiment can obtain higher performance than the conventional GaN-based HEMT 110a shown in FIG. 1 will be explained first. The source resistance in the GaN-based IHEMT 10a according to this embodiment is 1.2 Ω per unit gate width (1 mm), and is approximately half of 2.1 Ω in the GaN-based HEMT 110a with the structure shown in FIG. 1. In this manner, the GaN-based IHEMT 10a according to this embodiment has a low contact resistance between the source electrode 17 and channel layer 11. For this reason, the GaN-based IHEMT 10a according to this embodiment has a small parasitic resistance, a large maximum current, and a small knee voltage and, hence, can obtain higher output power than the GaN-based HEMT 110a with the structure shown in FIG. 1.

The reason why the GaN-based IHEMT 10a according to this embodiment can obtain higher performance than the conventional GaN-based IHEMT 110b shown in FIG. 2 will be explained below. In the GaN-based IHEMT 10a according to this embodiment, both the underlayer 14 and donor layer 13 are constituted by a material given by a general formula $Al_\beta Ga_{(1-\beta)}N$, and the former has a higher Al molar ratio than the latter, as described above. In such structure, as shown in FIG. 4, negative piezoelectric charges are accumulated near the interface of the donor layer 13 with the underlayer 14, and positive piezoelectric charges are accumulated near the interface of the donor layer 13 with the channel layer 11. For this reason, an effective potential barrier with respect to electrons is formed near the interface of the donor layer 13 with the underlayer 14, and accumulation of electronics in the donor layer 13 is suppressed. Furthermore, the positive piezoelectric charges accumulated near the interface of the donor layer 13 with the channel layer promote accumulation of electrons in the channel layer 11. As a result, a two-dimensional electron gas is accumulated at a high concentration near the interface of the channel layer 11 with the donor layer 13.

Figure 2:
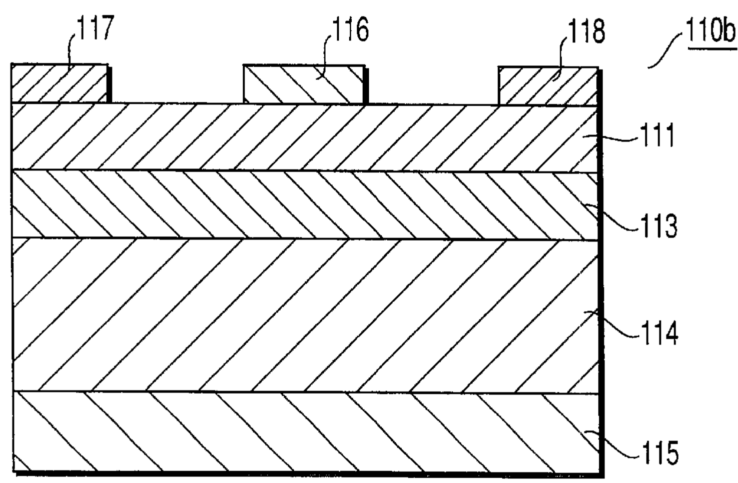
FIG. 2 is a schematic sectional view showing a conventional GaN-based inverted HEMT.

On the other hand, in the conventional GaN-based IHEMT 110b shown in FIG. 2, the underlayer 114 consists of GaN, and the donor layer 113 consists of $Al_\alpha Ga_{(1-\alpha)}N$ ($0<\alpha<1$), as described above. In this structure, as shown in FIG. 5, positive piezoelectric charges are accumulated near the interface of the donor layer 113 with the underlayer 114, and negative piezoelectric charges are accumulated near the interface of the donor layer 113 with the channel layer 111. For this reason, in the conventional GaN-based IHEMT 110*b* shown in FIG. 2, density of two-dimensional electron gas accumulated in the channel layer 111 is low.

The operations of such piezoelectric charges will be described in more detail below. Piezoelectric charges are generated due to a strain produced upon lattice matching layers having different lattice constants. According to the report of Asbeck et al., when a GaN layer is grown on the (0001) surface of a sapphire substrate, and an $Al_xGa_{(1-x)}N$ layer (0<x<1) is grown on this GaN layer, piezoelectric charges Pz given by:

$$Pz=2d_{31}(C_{11}+C_{12}+C_{13}^2/C_{33})\epsilon_{xx} \quad (1)$$

(where $d_{31}$ is a piezoelectric constant, $C_{11}$, $C_{12}$, $C_{13}$, and $C_{33}$ are elastic coefficients, and $\epsilon_{xx}$ is the strain amount) are produced near the interface of the $Al_xGa_{(1-x)}N$ layer with the GaN layer (Electronics letters, Vol. 33, No. 14, p. 1230, 1997). The amount $\epsilon_{xx}$ is given by:

$$\epsilon_{xx}=(a_{GaN}/a_{AlGaN})-1 \quad (2)$$

where aGaN is the lattice constant of GaN, and $a_{AlGaN}$ is the lattice constant of $Al_xGa_{(1-x)}N$.

Piezoelectric charges Pz produced near the interface of the donor layer 113 with the underlayer 114 in the conventional GaN-based IHEMT 110*b* shown in FIG. 2 were calculated using equations (1) and (2) above. Note that the piezoelectric charges were calculated under the assumption that a GaN underlayer 114 was formed on a sapphire substrate 115 to have a thickness (e.g., 3 μm) which was large enough for at least its surface to have a lattice constant equal to that of a bulk single crystal, and a donor layer 113 having a composition given by $Al_{0.15}Ga_{0.85}N$ was formed on that underlayer 114. Also, in this case, $d_{31}=-2\times10^{-10}$ cm/V (Asbeck, et al., Electronics letters, Vol. 33, No. 14, p. 1230, 1997), and $C_{11}=390$, $C_{12}=145$, $C_{13}=106$, and $C_{33}=398$ GPa (A. Polian, et al., J. Appl. Phys., Vol. 79, pp. 3343–3344, 1996). Furthermore, the lattice constant of GaN was $3.189\times10^{-1}$ nm, and as that of $Al_{0.15}Ga_{0.85}N$, $3.177\times10^{-1}$ nm calculated using the Vegard's Law were used.

In the conventional GaN-based IHEMT 110*b* shown in FIG. 2, since the lattice constant of the donor layer 113 is smaller than that of the underlayer 114, $\epsilon_{xx}$ assumes a positive value, as can be seen from calculation using equation (2). Therefore, as shown in FIG. 5, positive piezoelectric charges are accumulated near the interface of the donor layer 113 with the underlayer 114. Upon dividing the density of the piezoelectric charges by the absolute value of electron charges, a value as high as $4.5\times10^{12}$ $cm^{-2}$ was obtained. When positive piezoelectric charges are accumulated at high density near the interface of the donor layer 113 with the underlayer 114, negative piezoelectric charges are accumulated at approximately equal density near the interface of the donor layer 113 with the channel layer 111. For this reason, in the conventional GaN-based IHEMT 110*b* shown in FIG. 2, the density of two-dimensional electron gas near the interface of the channel layer 111 with the donor layer 113 is low and, hence, the maximum current is low.

As for the GaN-based IHEMT 10*a* according to the first embodiment of the present invention, piezoelectric charges Pz produced near the interface of the donor layer 13 with the underlayer 14 can be similarly calculated using equation (1) above. In this case, $\epsilon_{xx}$ uses a value given by:

$$\epsilon_{xx}=(a_{Al0.3Ga0.7N}/a_{Al0.15Ga0.85N})-1 \quad (3)$$

where $a_{Al0.3Ga0.7N}$ is the lattice constant of $Al_{0.3}Ga_{0.7}N$, and $a_{Al0.15Ga0.85N}$ is that of $Al_{0.15}Ga_{0.85}N$.

The lattice constant of $Al_{0.3}Ga_{0.7}N$ is smaller than that of $Al_{0.15}Ga_{0.85}N$. Therefore, in the GaN-based IHEMT 10*a* according to this embodiment, $\epsilon_{xx}$ assumes a negative value unlike the conventional GaN-based IHEMT 110*b* shown in FIG. 2. Hence, piezoelectric charges distribute, as shown in FIG. 4. When such piezoelectric charge distribution is obtained, higher density of two-dimensional electron gas is realized near the interface of the channel layer 11 with the donor layer 13 compared to a case wherein there are no piezoelectric charges. Therefore, the GaN-based IHEMT 10*a* of this embodiment can obtain a maximum current greatly higher than the conventional GaN-based IHEMT 110*b* shown in FIG. 2.

As described above, in this embodiment, the density of two-dimensional electron gas near the interface of the channel layer 11 with the donor layer 13 is increased by forming the piezoelectric charge distribution shown in FIG. 4, thus realizing high output power. Therefore, such effect becomes more conspicuous as the density of two-dimensional electron gas is higher. Note that the density of two-dimensional electron gas in the conventional GaN-based IHEMT is on the order of $10^{11}$ to $10^{13}/cm^{-2}$. For this reason, usually, the effect of increasing outputs conspicuously appears when the value obtained by dividing the density of piezoelectric charges by the absolute value of electron charges is equal to or larger than around $10^{10}/cm^{-2}$. In other words, usually, the aforementioned effect remarkably appears, when the difference between the lattice constants of the bulk of the donor layer 13 and underlayer 14 is 0.0009% or higher with respect to the lattice constant of the bulk of the donor layer 13, or when the difference between the molar ratio of Al in the donor layer 13 and that in the underlayer 14 is 0.00035 or higher.

In the first embodiment described above, the underlayer 14 is formed of $Al_xGa_{(1-x)}N$, the donor layer 13 is formed of $Al_yGa_{(1-y)}N$, and the channel layer 11 is formed of GaN. Alternatively, these layers may be formed of other materials. For example, the underlayer 14 may be formed of $Al_xGa_{(1-x)}N$ ($0<x\leqq1$), the donor layer 13 may be formed of GaN, and the channel layer 11 may be formed of $In_zGa_{(1-z)}N$ (0<z<1). As the substrate 15, a GaN substrate or the like may be used in place of a sapphire substrate.

The second embodiment of the present invention will be described below.

Figure 6:
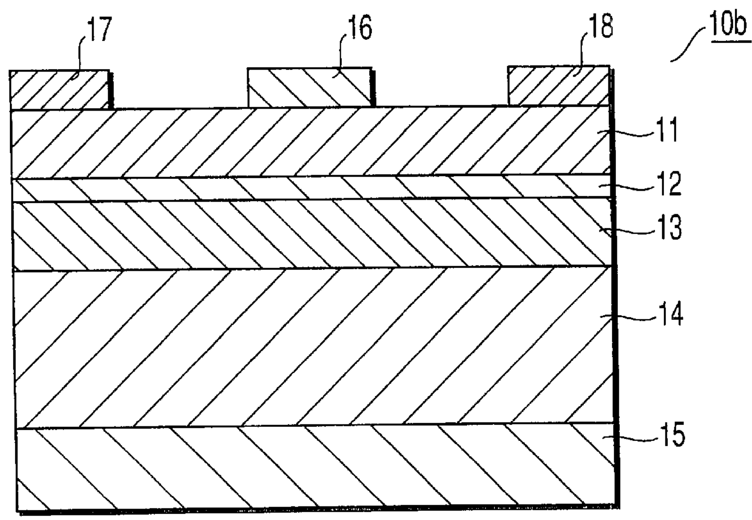
FIG. 6 is a schematic sectional view showing a group III nitride inverted HEMT according to the second embodiment of the present invention.

FIG. 6 is a schematic sectional view showing a group III nitride IHEMT according to the second embodiment of the present invention. An IHEMT 10*b* shown in FIG. 6 is a GaN-based IHEMT, and has the following structure. That is, an $Al_xGa_{(1-x)}N$ underlayer 14, a donor layer 13 consisting of $Al_yGa_{(1-y)}N$ as a major component, a spacer layer 12, and a GaN channel layer 11 are formed in turn on one major surface of a sapphire substrate 15, and a gate electrode 16, source electrode 17, and drain electrode 18 are formed on the channel of the channel layer 11. Namely, the GaN-based IHEMT 10*b* according to this embodiment is different from the GaN-based IHEMT 10*a* according to the first embodiment in that it has the spacer layer 12.

The GaN-based IHEMT 10*b* with such structure can be fabricated by, e.g., the following method. Following the same procedures as those described in the first embodiment, an undoped underlayer 14 and donor layer 13 were formed in turn on the (0001) surface of a sapphire substrate 15.

$Al_{0.15}Ga_{0.85}N$ was then grown on the donor layer 13 by MOCVD to form a 2-nm thick undoped spacer layer 12. This spacer layer 12 is not indispensable, but is effective for preventing electron mobility drop due to impurity scattering. Normally, the spacer layer 12 is a non-doped group III nitride semiconductor layer having the same Al concentration as that of the donor layer 13.

Subsequently, an undoped channel layer 11 was formed following the same procedures as those described in the first embodiment. After that, source and drain electrodes 17 and 18 were formed on the channel layer 11, and a gate electrode 16 was further formed. In this way, the GaN-based IHEMT 10*b* shown in FIG. 6 was fabricated.

Upon examining this GaN-based IHEMT 10*b*, the GaN-based IHEMT 10*b* had characteristics equivalent to those obtained by the GaN-based IHEMT 10*a* fabricated in the first embodiment.

Figure 7:
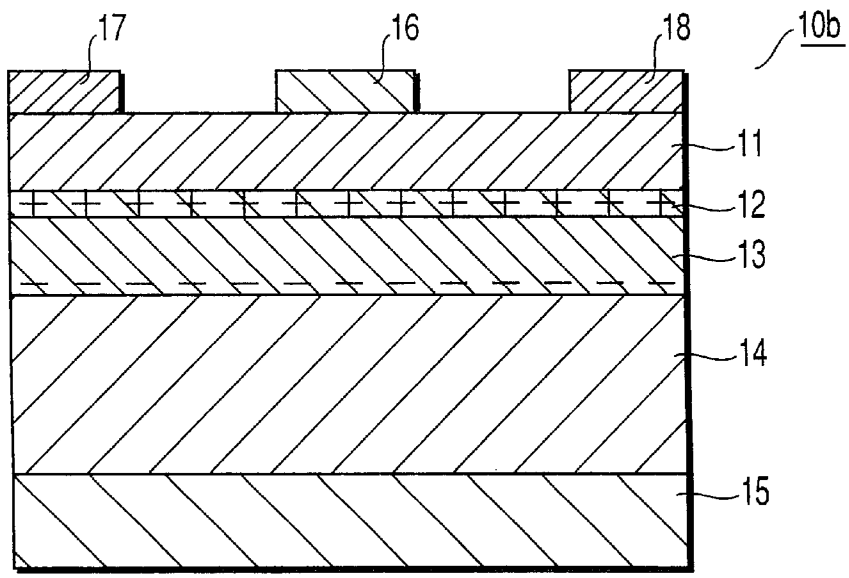
FIG. 7 is a schematic sectional view showing the distribution state of piezoelectric charges in the group III nitride inverted HEMT shown in FIG. 6.

FIG. 7 is a schematic sectional view showing he distribution state of piezoelectric charges in the GaN-based IHEMT 10*b* shown in FIG. 6. AS shown in FIG. 7, in the GaN-based IHEMT 10*b* according to this embodiment, negative piezoelectric charges are accumulated near the interface of the donor layer 13 with the underlayer 14 as in the first embodiment. On the other hand, positive piezoelectric charges are accumulated in the spacer layer 12 unlike the first embodiment. Even when such piezoelectric charge distribution is obtained, higher density of two-dimensional electron gas is realized near the interface of the channel layer 11 with the spacer layer 12 than a case wherein there are no piezoelectric charges. Therefore, the GaN-based IHEMT 10*b* according to this embodiment can obtain a maximum current equivalent to that of the GaN-based IHEMT 10*a* according to the first embodiment.

The third embodiment of the present invention will be described below.

Figure 8:
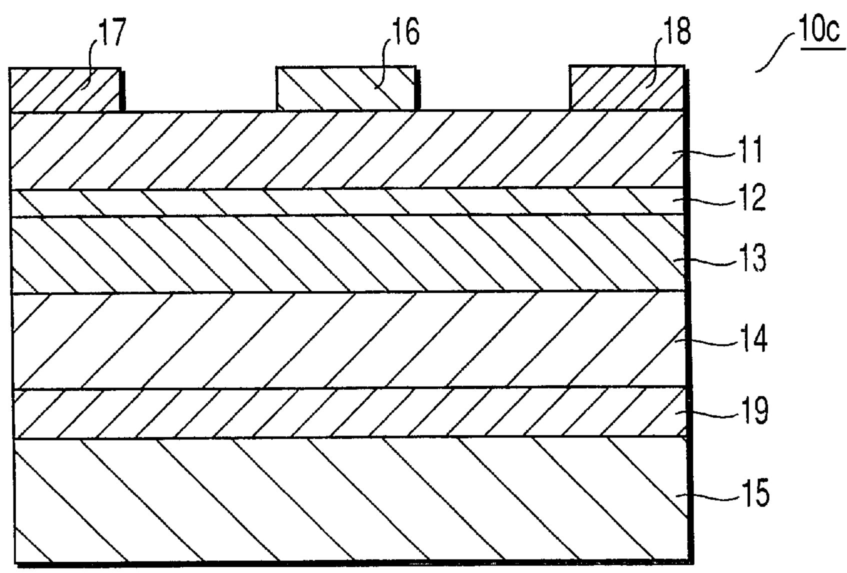
FIG. 8 is a schematic sectional view showing a group III nitride inverted HEMT according to the third embodiment of the present invention.

FIG. 8 is a schematic sectional view showing a group III nitride IHEMT according to the third embodiment of the present invention. An IHEMT 10*c* shown in FIG. 8 is a GaN-based IHEMT, and has the following structure. That is, a nucleation layer 19, an $Al_xGa_{(1-x)}N$ underlayer 14, a donor layer 13 consisting of $Al_yGa_{(1-y)}N$ as a major component, a spacer layer 12, and a GaN channel layer 11 are formed in turn on one major surface of a sapphire substrate 15, and a gate electrode 16, source electrode 17, and drain electrode 18 are formed on the channel of the channel layer 11. In other words, the GaN-based IHEMT 10*c* according to this embodiment is different from the GaN-based IHEMT 10*b* according to the second embodiment in that it has the nucleation layer 19.

The GaN-based IHEMT 10*c* with such structure can be fabricated by, e.g., the following method. AlN was grown on a sapphire substrate 15 by MOCVD using trimethyl aluminum and ammonia as source gases to form a 40-nm thick nucleation layer 19. The nucleation layer 19 provides a nucleus for crystal growth of the underlayer 14. The nucleation layer 19 is not an indispensable component, but formation of the nucleation layer 19 can improve the crystallinity of the underlayer 14. That is, the underlayer 14 can be formed as a single-crystal thin film which suffers less crystal defects.

Following the same procedures as those described in the first and second embodiments, an undoped underlayer 14, donor layer 13, spacer layer 12, and channel layer 11 were formed in turn on the nucleation layer 19. After that, source and drain electrodes 17 and 18 were formed on the channel layer 11, and a gate electrode 16 was further formed following the same procedures as those described in the first embodiment. In this manner, the GaN-based IHEMT 10*c* shown in FIG. 8 was fabricated.

Upon examining this GaN-based IHEMT 10*c*, the GaN-based IHEMT 10*c* had characteristics equivalent to those obtained by the GaN-based IHEMTS 10*a* and 10*b* according to the first and second embodiments. More specifically, in the GaN-based IHEMT 10*c* according to the third embodiment as well, positive piezoelectric charges were accumulated in the spacer layer 12, and higher density of two-dimensional electron gas is realized near the interface of the channel layer 11 with the spacer layer 12.

The fourth embodiment of the present invention will be described below. In the first to third embodiments, the group III nitride IHEMTs have been explained. In the fourth embodiment, an apparatus using such group III nitride IHEMTs will be explained.

Figure 9:
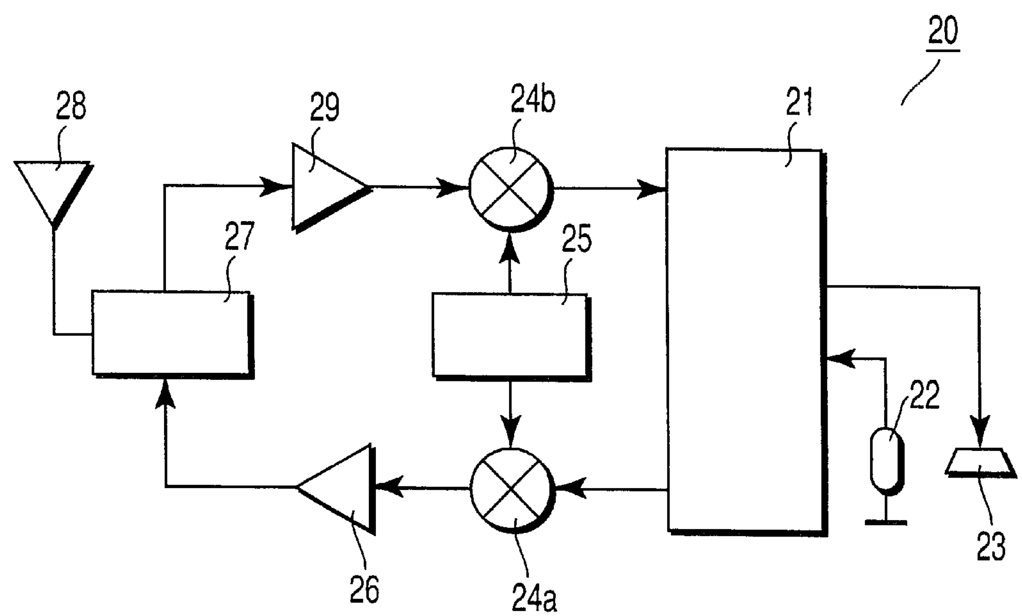
FIG. 9 is a block diagram of a mobile portable communication apparatus as a communication system according to the fourth embodiment of the present invention.

FIG. 9 is a block diagram of a mobile portable communication apparatus as a communication system according to the fourth embodiment of the present invention. This mobile portable communication apparatus 20 is characterized by mounting a power amplifier 26 which uses at least one of the group III nitride IHEMTs 10*a* to 10*c* described in the first to third embodiments. As described above, the group III nitride IHEMTs 10*a* to 10*c* according to the first to third embodiments can assure high-output power operations. Therefore, the power amplifier 26 using at least one of them can also assure high-output power operations. Note that the structure and the like of this power amplifier 26 will be described later.

The mobile portable communication apparatus 20 shown in FIG. 9 has a microphone 22 for inputting an analog signal to be transmitted. The microphone 22 is connected to a digital block 21, which converts an analog signal input from the microphone 22 into a digital signal and band-compresses this digital signal by a signal processing technique, upon transmission.

A mixer 24*a* is connected to the digital block 21. The mixer 24*a* is connected to a voltage controlled oscillator 25 and the power amplifier 26, and modulates a signal to be transmitted. That is, the mixer 24*a* performs $\pi/4$ shift QPSK (Quaternary Phase Shift Keying) modulation or the like of the digital signal, which has been band-compressed by the digital block 21, using a desired local oscillation signal from the voltage controlled oscillator 25, and outputs this modulated signal to the power amplifier 26 implemented as an MMIC (Monolithic Microwave Integrated Circuit).

An antenna 28 is connected to the power amplifier 26 via a switch 27. The modulated signal from the mixer 24*a* is amplified to transmission power by the power amplifier 26. The signal amplified to transmission power goes through the switch 27 that switches transmission/reception modes, and is then supplied to the antenna 28 via a signal line, thus energizing the antenna 28. In this manner, the mobile portable communication apparatus 20 transmits a signal.

A low-noise amplifier 29 is connected to the switch 27. Upon reception, a signal received by the antenna 28 is input to the low-noise amplifier 29 via the switch 27, and is amplified to a required signal level by the amplifier 29.

A mixer 24*b* is connected to the low-noise amplifier 29, and is also connected to the voltage controlled oscillator 25 and the digital block 21. The mixer 24*b* detects and demodulates the received signal amplified by the low-noise amplifier 29 using a local oscillation signal from the voltage controlled oscillator 25, and outputs the demodulated signal to the digital block 21.

The digital block 21 is connected to a loudspeaker 23. Upon reception, the digital block 21 band-expands the digital signal from the mixer 24*b* by a signal processing technique, converts it into an analog signal, and outputs a signal for driving the loudspeaker 23.

Note that this mobile portable communication apparatus 20 comprises a keyboard for key inputs, a power source circuit which uses a primary or secondary battery or the like as a power source, and the like, although they are not shown. In this embodiment, the power amplifier 26 is implemented as an MMIC, and the switch 27 and low-noise amplifier 29 are provided as independent components. Alternatively, the switch 27 and low-noise amplifier 29 may also be integrated on the MMIC.

Figure 10:
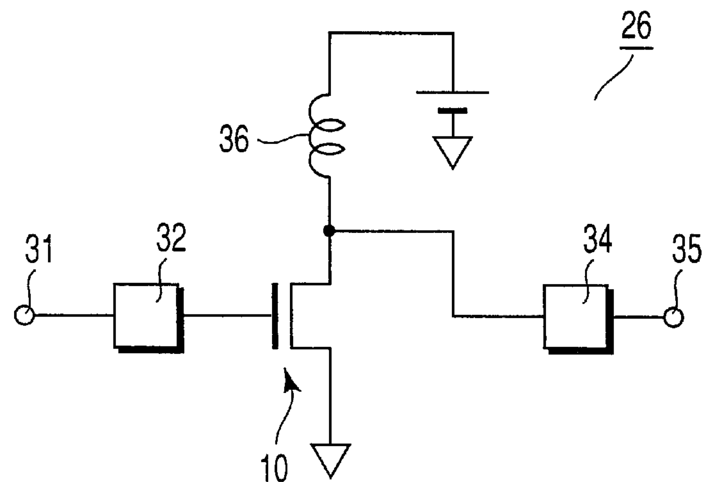
FIG. 10 is a circuit diagram showing an example of a power amplifier used in the mobile portable communication apparatus shown in FIG. 9.

FIG. 10 is a circuit diagram showing an example of the power amplifier 26 used in the mobile portable communication apparatus 20 shown in FIG. 9. Referring to FIG. 10, reference numeral 31 denotes an input terminal connected to the mixer 24*a* shown in FIG. 9; and 35, an output terminal connected to the switch 27 shown in FIG. 9. The input terminal 31 is connected to the gate electrode of a group III nitride IHEMT 10 via an impedance matching circuit 32. Note that the impedance matching circuit 32 is a known circuit that takes impedance matching, and one of the group III nitride IHEMTs 10*a* to 10*c* described in the first to third embodiments is used as the group III nitride IHEMT 10.

The source electrode of the group III nitride IHEMT 10 is connected to ground, and its drain electrode is connected to a power source via a choke coil 36. Note that this power source is a supply power source such as a secondary battery mounted in the mobile portable communication apparatus 20. The drain electrode of the group III nitride IHEMT 10 is connected to the output terminal 35 via a known impedance matching circuit 34 that takes impedance matching.

This power amplifier 26 can assure high-output operations since it uses one of the group III nitride IHEMTs 10*a* to 10*c* described in the first to third embodiments. Therefore, the mobile portable communication apparatus 20 that mounts this power amplifier 26 can achieve high-output operations.

In the power amplifier 26 shown in FIG. 10, one group III nitride IHEMT 10 is used. Alternatively, a multi-stage arrangement using two or more group III nitride IHEMTs 10 may be adopted. Also, the power amplifier 26 can be applied to a base station As described above, according to the present invention, the group III nitride IHEMT adopts a structure that produces negative piezoelectric charges in a region near the interface of the donor layer with the underlayer. For this reason, according to the present invention, the density of two-dimensional electron gas in the channel layer can be increased, and the contact resistance of the source and drain electrodes can be reduced to a sufficiently small value since the electrodes are formed on the channel layer. Therefore, the present invention can achieve remarkably higher outputs than the conventional technique.

More specifically, according to the present invention, a group III nitride high electron mobility transistor that can realize high output power is provided. Also, according to the present invention, a power amplifier using a group III nitride high electron mobility transistor that can realize high output power is provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A group III nitride inverted high electron mobility transistor comprising:

an underlayer comprising a first group III nitride compound semiconductor material;

a donor layer formed on said underlayer and comprising a second group III nitride compound semiconductor material, a lattice constant of a bulk of said donor layer being larger than a lattice constant of said underlayer;

a channel layer formed on said donor layer and comprising a third group III nitride compound semiconductor material; and gate, source, and drain electrodes formed on said channel layer, wherein the first group III nitride compound semiconductor material is $Al_xGa_{(1-x)}N$, the second group III nitride compound semiconductor material is $Al_yGa_{(1-y)}N$, x and y satisfy an inequality of $0 \leqq y < x \leqq 1$, and the third group III nitride compound semiconductor material is GaN.

2. A transistor according to claim 1, further comprising an $Al_yGa_{(1-y)}N$ spacer layer between said donor layer and said channel layer.

3. A transistor according to claim 1, further comprising a substrate and a nucleation layer formed on said substrate, and wherein said underlayer is formed by crystal growth, and said nucleation layer provides a nucleus for the crystal growth.

4. A group III nitride inverted high electron mobility transistor comprising:

an underlayer comprising a first group III nitride compound semiconductor material;

a donor layer formed on said underlayer and comprising a second group III nitride compound semiconductor material, a lattice constant of a bulk of said donor layer being larger than a lattice constant of said underlayer;

a channel layer formed on said donor layer and comprising a third group III nitride compound semiconductor material; and gate, source, and drain electrodes formed on said channel layer, wherein the first group III nitride compound semiconductor material is $Al_xGa_{(1-x)}N$, the second group III nitride compound semiconductor material is GaN, the third group III nitride compound semiconductor material is $In_zGa_{(1-z)}N$, and x and z respectively satisfy the inequalities $0<x<0$ and $0<z<1$.

5. A transistor according to claim 4, further comprising a GaN spacer layer between said donor layer and said channel layer.

6. A transistor according to claim 4, further comprising a substrate and a nucleation layer formed on said substrate, wherein said underlayer is formed by crystal growth, and said nucleation layer provides a nucleus for the crystal growth.

* * * * *